US012581699B2

(12) United States Patent
Schmidt et al.

(10) Patent No.: US 12,581,699 B2
(45) Date of Patent: Mar. 17, 2026

(54) VDMOS HAVING AN EDGE TERMINATION REGION WITH DOPING CONCENTRATION DECREASING FROM INNER REGION TOWARD THE EDGE

(71) Applicant: Infineon Technologies AG, Neubiberg (DE)

(72) Inventors: Gerhard Schmidt, Wernberg-Wudmath (AT); Elmar Falck, Hohenbrunn (DE)

(73) Assignee: Infineon Technologies AG, Neubiberg (DE)

( * ) Notice: Subject to any disclaimer, the term of this patent is extended or adjusted under 35 U.S.C. 154(b) by 983 days.

(21) Appl. No.: 16/851,479

(22) Filed: Apr. 17, 2020

(65) Prior Publication Data

US 2020/0335579 A1 Oct. 22, 2020

(30) Foreign Application Priority Data

Apr. 18, 2019 (DE) .......................... 102019110330.4

(51) Int. Cl.
*H10D 62/10* (2025.01)
*H10D 62/17* (2025.01)
*H10D 62/832* (2025.01)

(52) U.S. Cl.
CPC ......... *H10D 62/106* (2025.01); *H10D 62/112* (2025.01); *H10D 62/328* (2025.01); *H10D 62/8325* (2025.01)

(58) Field of Classification Search
CPC ............. H01L 29/0619; H01L 29/0638; H01L 29/1058; H01L 29/1608
See application file for complete search history.

(56) References Cited

U.S. PATENT DOCUMENTS

| 5,093,693 A | 3/1992 | Abbas et al. |
| 2006/0197159 A1 | 9/2006 | Schmidt |

(Continued)

FOREIGN PATENT DOCUMENTS

| CN | 106328712 A | 1/2017 |
| DE | 10358985 B3 | 5/2005 |

(Continued)

OTHER PUBLICATIONS

Tantraporn, Wirojana, et al., "Multiple-Zone Single-Mask Junction Termination Extension—A High-Yield Near-deal Breakdown Voltage Technology", IEEE Transactions on Electron Devices, vol. Ed-34, No. 10, Oct. 1987, pp. 2200-2210.

(Continued)

*Primary Examiner* — Anh D Mai
(74) *Attorney, Agent, or Firm* — Murphy, Bilak & Homiller, PLLC

(57) ABSTRACT

A semiconductor device includes: a semiconductor body with an edge region arranged between an inner region and an edge surface; a first semiconductor region of a first doping type in the inner region; and a second semiconductor region of a second doping type in the inner and edge regions. An edge termination structure includes: a third semiconductor region in the edge region adjoining the first semiconductor region; a surface section of the second semiconductor region adjoining a first main surface of the semiconductor body; and an amorphous passivation layer having a specific resistance higher than $10^9$ $\Omega$cm adjoining the third semiconductor region and the surface section. An electrically active doping dose of the third region at a lateral position spaced apart from the first region by 50% of a width of the edge termination structure is at least $Q_{BR}/q$, wherein $Q_{BR}$ is breakdown charge and q is elementary charge.

15 Claims, 10 Drawing Sheets

(56) References Cited

U.S. PATENT DOCUMENTS

| | | | | |
|---|---|---|---|---|
| 2010/0052047 | A1 * | 3/2010 | Schmidt ............. | H01L 29/7397 |
| | | | | 438/270 |
| 2010/0078765 | A1 | 4/2010 | Schulze et al. | |
| 2010/0320536 | A1 * | 12/2010 | Schmidt ............... | H01L 29/739 |
| | | | | 257/E29.256 |
| 2011/0272735 | A1 * | 11/2011 | Schmidt ................. | H01L 29/74 |
| | | | | 257/E29.024 |
| 2017/0250258 | A1 | 8/2017 | Yang et al. | |
| 2018/0286944 | A1 | 10/2018 | Meiser et al. | |

FOREIGN PATENT DOCUMENTS

| | | | | |
|---|---|---|---|---|
| DE | 102005004355 A1 | 8/2006 | | |
| DE | 102014108986 A1 | 12/2014 | | |
| EP | 0311816 A1 * | 4/1989 | ............. | H01L 29/91 |

OTHER PUBLICATIONS

Zhou, Cai-Neng, et al., "Step JTE, an Edge Termination for UHV SiC Power Devices With Increased Tolerances to JTE Dose and Surface Charges", IEEE Transactions on Electron Devices, vol. 64, No. 3, Mar. 2017, pp. 1193-1196.

* cited by examiner

103

110

120

VDMOS HAVING AN EDGE TERMINATION REGION WITH DOPING CONCENTRATION DECREASING FROM INNER REGION TOWARD THE EDGE

TECHNICAL FIELD

This disclosure relates in general to a semiconductor device, in particular a semiconductor device with an edge termination structure.

BACKGROUND

Power semiconductor devices, such as power diodes, power MOSFETs, power IGBTs, or power thyristors, are designed to withstand high blocking voltages. Those power devices include a pn-junction formed between a p-doped semiconductor region and an n-doped semiconductor region. The device blocks (is switched off) when the pn-junction is reverse biased by applying a suitable voltage to the pn-junction. In this case a depletion region (space charge region) expands in the p-doped region and the n-doped region. Usually one of the p-doped region and the n-doped region is more lightly doped than the other one of the p-doped region and the n-doped region, so that the depletion region mainly expands in the more lightly doped region, which mainly supports the voltage applied across the pn-junction. The more lightly doped region supporting the blocking voltage is usually referred to as base region in a diode or thyristor and as drift region in a MOSFET or an IGBT.

The ability of a pn-junction to support high voltages is limited by the avalanche breakdown phenomenon. As a voltage applied across the pn-junction increases, an electric field in the semiconductor regions forming the pn-junction increases. The electric field results in acceleration of mobile carriers induced by thermal generation in the space charge region. An avalanche breakdown occurs when, due to the electric field, the charge carriers are accelerated such that they create electron-hole pairs by impact ionization. Charge carriers created by impact ionization create new charge carriers, so that there is a multiplication effect. At the onset of avalanche breakdown a significant current flows across the pn-junction in the reverse direction. The electric field at which the avalanche breakdown sets in is referred to as critical electric field. The absolute value of the critical electric field is mainly dependent on the type of semiconductor material used for forming the pn-junction, and is weakly dependent on the doping concentration of the more lightly doped semiconductor region. A voltage blocking capability of the semiconductor device is the voltage applied to the pn-junction at which the critical electric field occurs in the semiconductor device. This voltage is often referred to as breakdown voltage.

The voltage blocking capability is not only dependent on the type of semiconductor material and its doping, but also on the specific geometry of the semiconductor device. A power semiconductor device includes a semiconductor body of finite size that is terminated by edge surfaces in lateral directions of the semiconductor body. A vertical power semiconductor device is a semiconductor device in which the pn-junction mainly extends in a horizontal plane of the semiconductor body. In such vertical power semiconductor device the pn-junction usually does not extend to the edge surface of the semiconductor body. Instead, the pn-junction is distant to the edge surface of the semiconductor body in a lateral direction. In this case, a semiconductor region (edge region) of the semiconductor body adjoining the pn-junction in the lateral direction also has to withstand the voltage applied to the pn-junction.

The edge region may be implemented with a planar edge termination structure that includes a passivation layer formed on top of a surface of the semiconductor body in an edge region of the semiconductor body. In a manufacturing process of the semiconductor device and/or during operation of semiconductor device the passivation layer may be contaminated by ions, such as alkaline ions, hydronium ($H_3O^+$) ions, or hydroxide ($OH^-$) ions. These ions may affect the distribution of the electric field in the edge region by electrostatic induction effect in such a way that a voltage blocking capability of the semiconductor device is reduced.

There is therefore a need for a semiconductor device with a planar edge termination structure that is robust against parasitic ions (charges).

SUMMARY

One example relates to a semiconductor device. The semiconductor device includes a semiconductor body with a first main surface, an edge surface, an inner region, and an edge region arranged between the inner region and the edge surface, a first semiconductor region of a first doping type arranged in the inner region and a second semiconductor region of a second doping type arranged in the inner region and the edge region, wherein a pn-junction is formed between the first semiconductor region and the second semiconductor region, and an edge termination structure.

The edge termination structure includes a third semiconductor region of the first doping type that is arranged in the edge region and adjoins the first semiconductor region, wherein a doping dose of the third semiconductor region decreases towards the edge surface. The edge termination structure further includes a surface section of the second semiconductor region adjoining the first main surface, and an amorphous passivation layer. The amorphous passivation layer has a specific resistance higher than $10^9$ (=1E9) $\Omega$cm (Ohm·cm), is formed on the first main surface, and adjoins the third semiconductor region and the surface section of the second semiconductor region. Further, the edge termination structure has a width in the semiconductor body in the lateral direction, and an electrically active doping dose of the third semiconductor region at a lateral position that is spaced apart from the first semiconductor region by 50% of the width of the edge termination structure is at least $Q_{BR}/q$, wherein $Q_{BR}$ is the breakdown charge of the semiconductor material of the semiconductor body and q is the elementary charge.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1A:
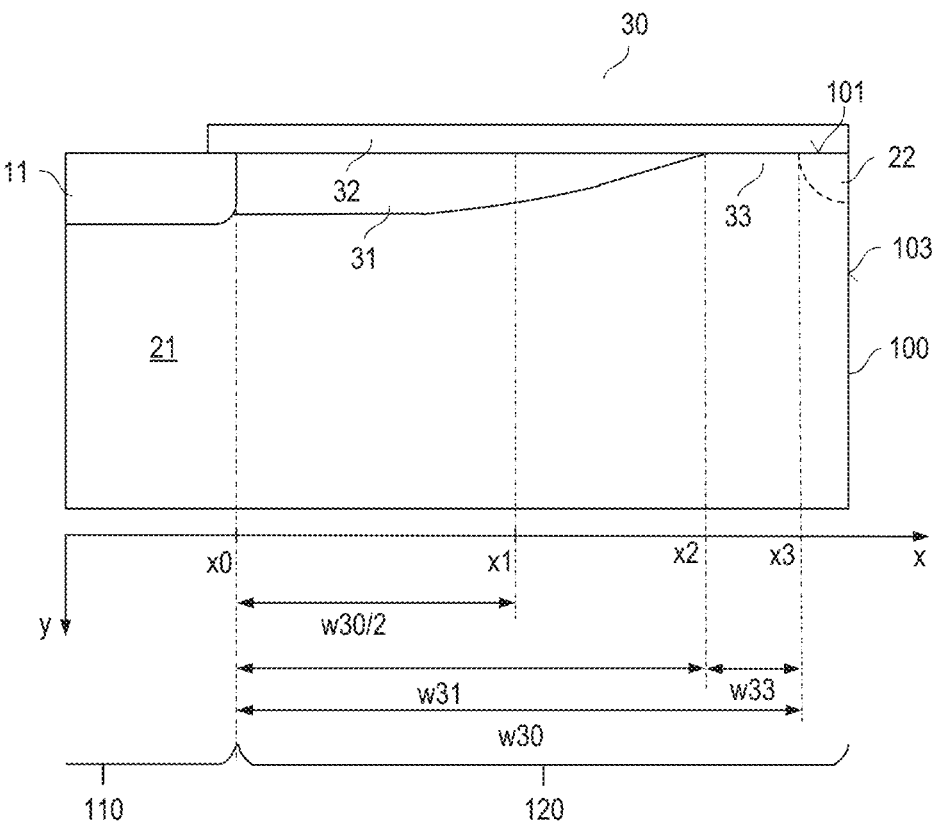
FIG. 1A shows a vertical cross-sectional view of one section of a semiconductor device that includes a pn-junction in an inner region and an edge termination structure with an amorphous passivation layer in an edge region.

FIG. 1A schematically illustrates a vertical cross-sectional view of one section of a semiconductor device. The semiconductor device includes a semiconductor body 100 with a first main surface 101, an edge surface 103, an inner region 110 and an edge region 120. The edge region 120 is arranged between the inner region 110 and the edge surface 103. The semiconductor body 100 may be comprised of a conventional semiconductor material such as, for example, silicon (Si), silicon carbide (SiC), gallium nitride (GaN) gallium arsenide (GaAs), or the like.

Figure 2:
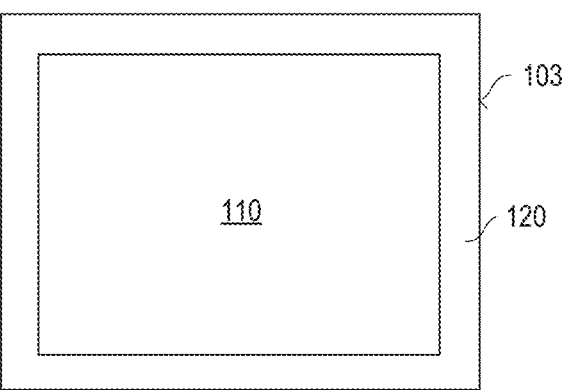
FIG. 2 illustrates one example of a top view of the semiconductor device shown in FIG. 1A.

FIG. 2 illustrates a top view of the first surface 101 of the semiconductor body 100 according to one example in order to illustrate a position of the inner region 110 relative to the edge region 120 in the semiconductor body 100. Referring to FIG. 2, the edge region 120 surrounds the inner region 110 and separates the inner region 110 from the edge surface 103. Just for the purpose of illustration, the semiconductor body 100 is rectangular in the example illustrated in FIG. 2.

This, however, is only an example. According to another example (not shown) the semiconductor body 100 is circular.

Referring to FIG. 1A, the semiconductor device further includes a first semiconductor region 11 of a first doping type, wherein the first semiconductor region 11 is arranged in the inner region 110 of the semiconductor body 100. In the example shown in FIG. 1A, the first semiconductor region 11 adjoins the first surface 101. This, however, is only an example. According to further examples explained herein further below, it is also possible to implement the first semiconductor region 11 in such a way that it is spaced apart from the first surface 101. The semiconductor device further includes a second semiconductor region 21 of a second doping type, wherein the second doping type is complementary to the first doping type. The second semiconductor region 21 is arranged in the inner region 110 and the edge region 120. Further, the second semiconductor region 21 adjoins the first semiconductor region 11 in the inner region 110 so that a pn-junction is formed between the first semiconductor region 11 and the second semiconductor region 21. Referring to FIG. 1A, the second semiconductor region 21 may adjoin the edge surface 103 of the semiconductor body 100. According to one example, the first semiconductor region 11 is a p-type region and the second semiconductor region 21 is an n-type region.

Referring to FIG. 1A, the semiconductor device further includes an edge termination structure 30. This edge termination structure 30 includes a third semiconductor region 31 of the first doping type. This third semiconductor region 31 is arranged in the edge region 120 and adjoins the first semiconductor region 11. The third semiconductor region 31 may adjoin the first surface 101. Further, a doping dose of the third semiconductor region 31 decreases towards the edge surface 103. This includes that there is at least one section of the third region 31 in which the doping dose decreases as a distance to the edge surface 103 decrease. However, there may also be sections in which the doping dose is essentially constant over a certain length in a direction towards the edge surface 103. "The doping dose" is the integral of the doping concentration of the third semiconductor region 31 in a vertical direction y of the semiconductor body 100, wherein the vertical direction y is a direction perpendicular to the first surface 101. In particular, the doping dose of the third region 31 is the effective doping dose, which is the integral of the effective and electrically active doping concentration of the third region 31.

The third semiconductor region 31 adjoins the second semiconductor region 21 in the edge region 120 of the semiconductor body 100. Further, the edge termination structure 30 includes a section 33 of the second semiconductor region 21 that adjoins the first surface 101. This section 33 of the second semiconductor region 21 is referred to as surface section 33 of second semiconductor region 21 or fourth semiconductor region 33 in the following.

Further, the edge termination structure 30 includes an amorphous passivation layer 32 on top of the first surface 101 in the edge region 120. The amorphous passivation layer 32 adjoins the third semiconductor region 31 and the surface section 33 of the second semiconductor region 21 and, as illustrated in FIG. 1A, may also cover a section of the first semiconductor region 11. The amorphous passivation layer 32 is semi-isolating and has a specific resistance higher than 1E9 ($=10^9$) $\Omega$cm (Ohm·cm). According to one example, the specific resistance is higher than 1E10 $\Omega$cm or higher than 1E11 Ωcm. Further, the specific resistance is lower than 1E14 Ωcm, according to one example.

A pn-junction between the first region 11 and the second region 21 can be reverse biased by applying a suitable voltage between the first region 11 and the second region 21. When the pn-junction is reverse biased, a space charge region (depletion region) expands in the first region 11 and the second region 21. According to one example, the first region 11 is more highly doped than the second region 21. In this case, the depletion region mainly expands in the second region 21. According to one example, an (average) doping concentration of the first region 11 is at least 10 times or at least 100 times an (average) doping concentration of the second region 21. The first region 11 may be formed by an implantation process. According to one example, a doping dose in this implantation process is such that an (average) doping concentration of the first region 11 is selected from between 1E16 cm$^{-3}$ and 1E18 cm$^{-3}$, wherein the doping concentration is essentially given by the doping dose divided by a depth of the first region 11 in a vertical direction of the semiconductor body, which is a direction perpendicular to the first surface 101. The second region 21 may be formed by an epitaxial growth process, wherein the first region 11 and the doped regions of the edge termination structure 30 may be formed by implanting doping atoms into the epitaxial layer. A doping concentration of the second region 21 is selected from between 1E12 cm$^{-3}$ and 1E17 cm$^{-3}$, for example.

Figure 3A:
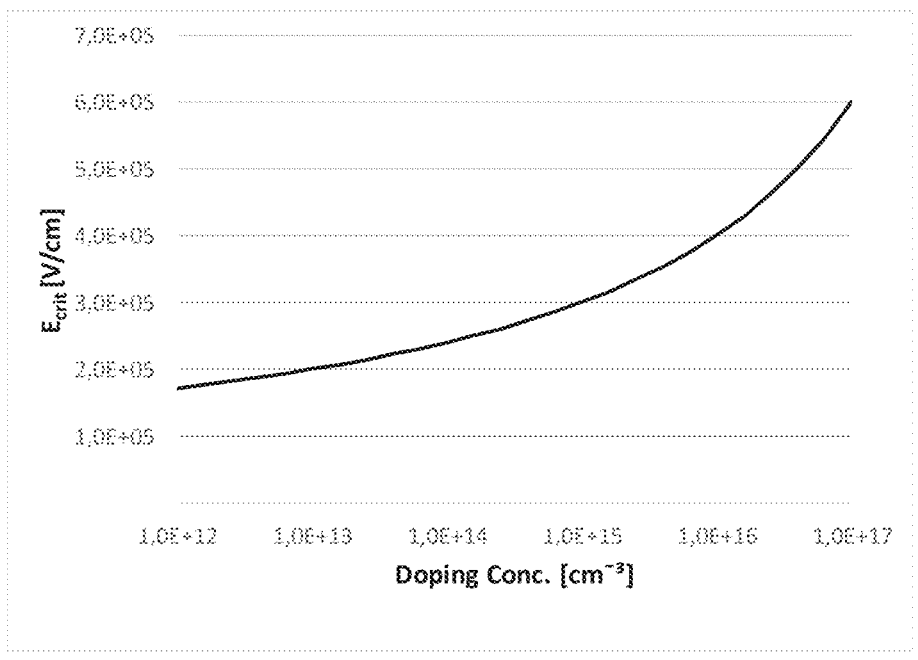
FIG. 3A illustrates the critical electrical field at an abrupt pn-junction formed between two complementarily doped semiconductor regions dependent on a doping concentration of a lower doped one of the two semiconductor regions.

A pn-junction is also formed between the third region 31 and the second region 21. When the pn-junction between the first region 11 and the second region 21 is reverse biased, the pn-junction between the third region 31 and the second region 21 is also reverse biased, so that a depletion region also expands in the third region 31 and the second region 21 in the edge region 120. An avalanche breakdown occurs when a magnitude of the voltage that reverse biases the pn-junctions is such that a magnitude of an electric field at one position reaches a critical value, which is usually referred to as E$_{crit}$. This critical value E$_{crit}$ is dependent on a doping concentration of the lower doped second region 21 and, of course, the type of semiconductor material. The critical value E$_{crit}$ dependent on the doping concentration of the second region 21 in a semiconductor device having a monocrystalline silicon (Si) semiconductor body 100 is illustrated in FIG. 3A. As can be seen from FIG. 3A, the critical value E$_{crit}$ increases as the doping concentration increases. More specifically, as the doping concentration increases from 1E12 cm$^{-3}$ to 1E17 cm$^{-3}$, for example, the critical value E$_{crit}$ increases from about 1.7E5 V/cm to about 6.0 E5 V/cm. When the semiconductor body 100 is comprised of silicon carbide (SiC) of the 6H-SiC-type, for example, the critical value E$_{crit}$ is higher and increases from about 1E6 V/cm to about 4E6 V/cm as the doping concentration of the second region 21 increases from 1E14 cm$^{-3}$ to 5E17 cm$^{-3}$.

A "voltage blocking capability" of the semiconductor device is given by a voltage level of the reverse biasing voltage at which the critical value E$_{crit}$ is reached. The "reverse biasing voltage" is the voltage that reverse biases the pn-junctions between the first region 11 and the second region 21 and between the third region 31 and the second region 21. In the inner region 110 the pn-junction is essentially planar and parallel to the first surface 101, while the pn-junction in the edge termination structure 30 is curved. It is commonly known that the same voltage applied to a planar pn-junction and to a curved pn-junction causes a higher electric field at the curved pn-junction than at the planar pn-junction. For this reason, the voltage blocking capability in the inner region 110 is usually higher than in the edge region, wherein the lower voltage blocking capability in the edge region 120 defines the overall voltage blocking capability of the semiconductor device. Thus, the edge region 120 is required to achieve a certain voltage blocking capability of the semiconductor device. However, the edge region 120 does not improve other parameters of the semiconductor device such as conduction losses. Basically, it is desirable (a) to implement the edge region 120 with a small area relative to an area of the inner region 110; (b) to achieve a high voltage blocking capability of the semiconductor device in the edge region 120; and to design the edge termination structure 30 such that it is robust against parasitic charges such as alkaline, hydronium or hydroxide ions that may be introduced into the passivation layer 32 in a manufacturing process of the semiconductor device and/or during operation of the semiconductor device.

In the edge termination structure 30 illustrated in FIG. 1A, this is achieved by implementing the third semiconductor region 31 in such a way that the doping dose decreases towards the edge surface 103, but still has a relatively high doping dose in the middle of the edge termination structure 30. Referring to FIG. 1A, the edge termination structure 30 has an overall width w30 in a lateral direction x, which is a direction from the first region 11 towards the edge region 103. The width w30 of the edge termination structure 30 is given by a width w31 of the third region 31 in the lateral direction x and a width w33 of the surface section 33 in the lateral direction x.

In the example shown in FIG. 1A, the semiconductor device includes a channel stopper 22. The channel stopper is of the second doping type and is more highly doped than the second region 21. According to one example, a doping concentration of the channel stopper 22 is at least 1E2 times the doping concentration of the second region 21. In this example, the surface section 33 is arranged between the third region 31 and the channel stopper 22, wherein the surface section 33 ends at the channel stopper 22. In this example, the width w30 of the edge termination structure 30 in the semiconductor body 100 is given by a (shortest) distance between the first region 11 and the channel stopper 22. The channel stopper 22, however, is optional. When the channel stopper 22 is omitted, the surface section 33 ends at the edge surface 103. In this case, the width w30 of the edge termination structure 30 in the semiconductor body 100 is given by a (shortest) distance between the first region 11 and the edge surface 103.

The "middle" of the edge termination structure 30 is at a first position x1, wherein this first position x1 is spaced apart from the first region 11 by a distance that is 50% of the overall width w30 of the edge termination structure 30. At this first position x1, the doping dose of the third region 31 is at least Q$_{BR}$/q, wherein Q$_{BR}$ is the breakdown charge of the semiconductor material of the semiconductor body 100 and q is the elementary charge (1.6E-19 C). Q$_{BR}$/q is also referred to as breakdown doping dose S$_{BR}$ in the following.

Figure 3B:
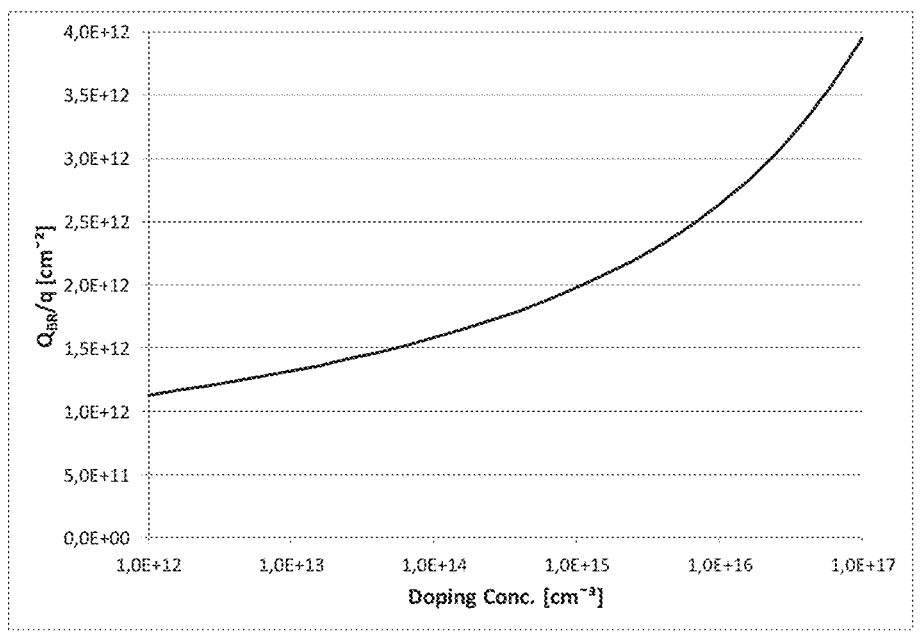
FIG. 3B illustrates the breakdown charge relative to the elementary charge of a higher doped one of the two semiconductor regions forming the pn-junction dependent on a doping concentration of the lower doped one of the two semiconductor regions.

Referring to the above, a depletion regions expands in the second region 21 when the pn-junction between the third region 31 and the second region 21 is reverse biased. Such depletion region is associated with an ionization of dopant atoms in the second region 21 and the third region 31. The breakthrough charge Q$_{BR}$ is the integral of the ionized dopant atoms per square unit in the second region 21 in a direction perpendicular to the pn-junction when the critical value $E_{crit}$ occurs at the pn-junction. The breakthrough charge $Q_{BR}$ is associated with the critical value $E_{crit}$ as follows:

$$Q_{BR}=\varepsilon_r \cdot \varepsilon_0 \cdot E_{crit} \qquad (1),$$

where $\varepsilon_0$ is the vacuum permittivity, and $\varepsilon_r$ is the relative permittivity of the material of the semiconductor body 100. The relative permittivity $\varepsilon_r$ of silicon, for example, is about 11.9 and the relative permittivity $\varepsilon_r$ of 6H-SiC is, for example, about 9.66. As, referring to FIG. 3A, the critical value $E_{crit}$ is dependent on the doping concentration of the second region 21 and the breakthrough charge $Q_{BR}$ is dependent on the critical value $E_{crit}$, the breakthrough charge $Q_{BR}$ is also dependent on the doping concentration of the second region 21. This is illustrated in FIG. 3B. FIG. 3B shows the breakthrough doping dose $D_{BR}$ ($=Q_{BR}/q$) of a semiconductor device having a silicon semiconductor body 100 dependent on the doping concentration of the second region 21.

Figure 4A:
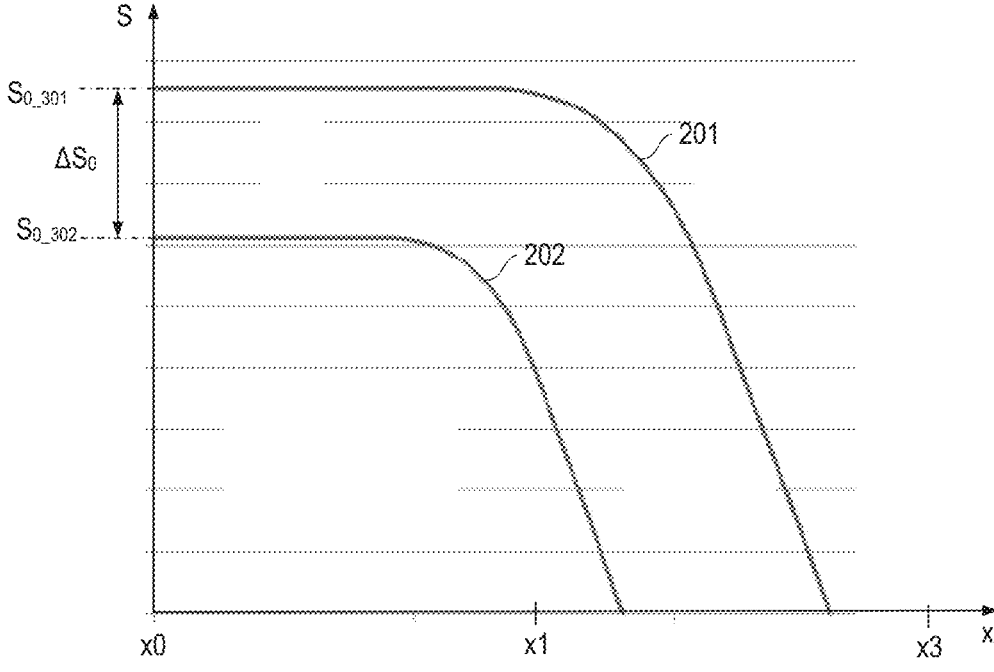
FIGS. 4A and 4B illustrate the dependency of a voltage blocking capability of the semiconductor device dependent on a doping dose profile of a semiconductor region of the edge termination structure in a semiconductor device of the type illustrated in FIG. 1A and a conventional semiconductor device.

The relatively high doping dose of the third region 31, that is, a doping dose S higher than the breakdown doping dose $S_{BR}$ in the middle x1 of the edge termination structure 30, in combination with the amorphous passivation layer 32 makes the edge termination structure 30 robust against parasitic charges. This is explained with reference to FIGS. 4A and 4B in the following. In FIG. 4A, curve 201 represents the doping dose S of the third region 31 according to one example. In this example, the doping dose S has a maximum value $S_{0\_301}$ at a position x0 where the third region 31 adjoins the first region 11. This position x0 is referred to as beginning of the edge termination structure 30 in the following. In the example illustrated in FIG. 4A, the doping dose is essentially constant up to the middle x1 or beyond and then decreases. This maximum value $S_{0\_301}$ is higher than the breakthrough dose $S_{BR}$.

Referring to the above, forming the first region 11 may include a first implantation process. In this process, an implantation mask (not shown) is formed on top of the first surface 101 of the semiconductor body such that those regions of the surface 101 below which the first region 11 is to be formed are uncovered by the implantation mask, while other regions are covered by the implantation mask. Further, dopant atoms of the first doping type are implanted into the semiconductor body 100 via the first surface 101 using the implantation mask. Equivalently, forming the third region 31 may include a second implantation process in which dopant atoms of the first doping type are implanted. In this process, an implantation mask covers the inner region 110, while the edge region 120 is at least partially uncovered. One example of a process for forming the third region 31 is explained with reference to FIG. 10 herein further below.

Forming the first region 11 and the second third region may further include a thermal process in which the implanted dopant atoms diffuse and are activated, wherein one common thermal process may be employed to form both the first region 11 and the third region 31. The effective doping dose of the finished first region 11 is the integral of the doping concentration of the dopant atoms of the first doping type minus the dopant atoms of the second doping type (that may result from a basic doping of the semiconductor body 10 before the implantation process) in the vertical direction y in the first region 11. This effective doping dose is lower than an implantation dose used in the first implantation process mentioned above, because not each of the implanted dopant atoms is activated and because of a certain amount of dopant atoms of the second doping type that are present in the first region 11. Nevertheless, at a given basic doping concentration of the semiconductor body 100 and a known ratio of activated versus non-activated dopant atoms in the thermal process the effective doping dose of the first region 11 can be adjusted relatively precisely by suitably adjusting the implantation dose in the first implantation process that is part of forming the first region 11. Equivalently, the effective doping dose of the third region 31 can be adjusted relatively precisely by suitably adjusting the implantation dose in the second implantation process that is part of forming the third region 31.

Figure 1B:
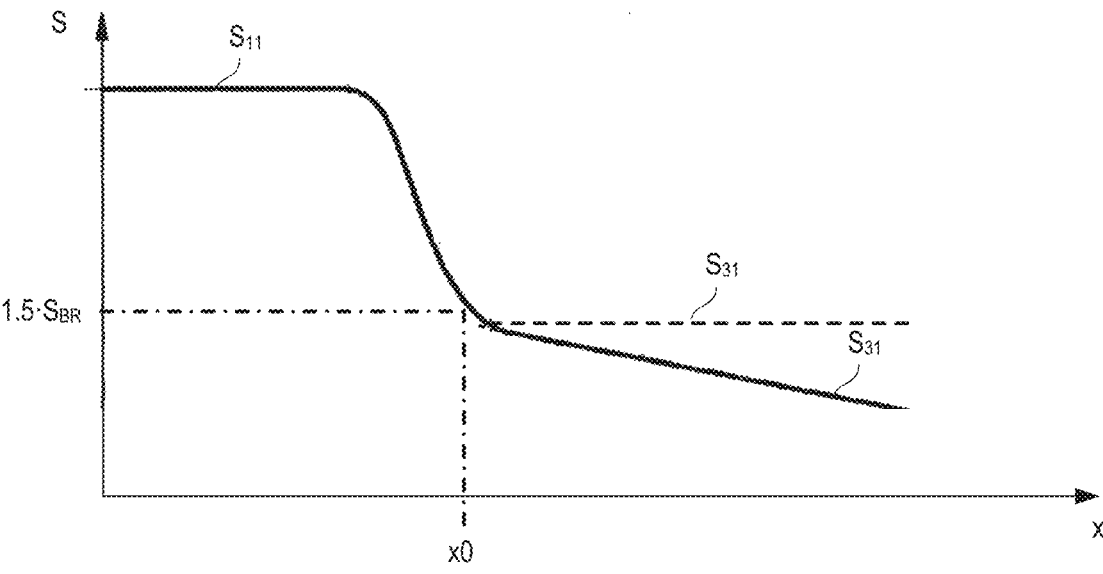
FIG. 1B illustrates one example of a doping dose profile in the semiconductor device illustrated in FIG. 1A.

FIG. 1B schematically illustrates the doping dose profile of the first region 11 and the third region 31 in a region that includes an interface between the first region 11 and the third region 31. Referring to FIG. 1B, the effective doping dose of the first region 11 is essentially constant at positions spaced away from the third region 31, wherein $S_{11}$ denotes the effective doping dose at these positions. This doping dose $S_{11}$ is defined by the implantation dose in the first implantation process. Equivalently, an effective doping dose $S_{31}$ of the third region 31 is defined by the implantation dose in the second implantation process. This effective doping dose may decrease in the lateral direction x, as illustrated in solid lines in FIG. 1B, or may be essentially constant over a certain distance in the lateral direction x, as illustrated in dashed lines. The first region 11 further includes a transition region. This transition region, due to the diffusion in the thermal process, may include dopant atoms from the implantation process that is part of forming the first region 11 and the implantation process that is part of forming the third region 31. In this transition region, the effective doping dose rapidly decreases from $S_{11}$ to $S_{31}$.

According to one example, the effective doping dose $S_{11}$ defined by the implantation dose in the first implantation process that is significantly higher than 1.5 times the breakdown dose $S_{BR}$, such as for example between 5 times and 10 times $S_{BR}$. In this example, the beginning x0 of the third region 31 may be defined as a position at which the effective doping dose in the transition region has decreased to 1.5 times the breakdown dose $S_{BR}$.

Referring to FIG. 1B, a magnitude of a slope of the doping dose profile in the lateral direction x has a first local minimum (which is zero) in the region where the effective doping doses is $S_{11}$ (e.g., this is a region not covered by the passivation layer 32). In the transition region, the magnitude of the slope increases from the first local minimum to a maximum and again decreases towards the third region, where the slope reaches a second local minimum, which may be zero (see the dashed line) or different from zero (see the solid line). Thus, according to another example, the beginning x0 of third region 31 is at a position where a magnitude of the slope of the doping profile S reaches a second minimum, when moving from the first region 11 towards the third region 31 along the lateral direction x.

Curve 202 in FIG. 4A illustrates the doping dose of a third region in a conventional edge termination structure that includes an oxide layer instead of an amorphous passivation layer (and without consideration of surface charges). In this case, the doping dose of the third region also decreases towards the edge surface 103, but has a lower maximum doping dose, that is, a maximum doping dose $S_{0\_302}$ of the third region in the conventional edge termination structure is lower than the maximum doping dose $S_{0\_301}$ of the third region in an edge termination structure of the type illustrated in FIG. 1A. $\Delta S_0$ denotes the difference between these two maximum values $S_{0\_301}$, $S_{0\_302}$.

Figure 4B:
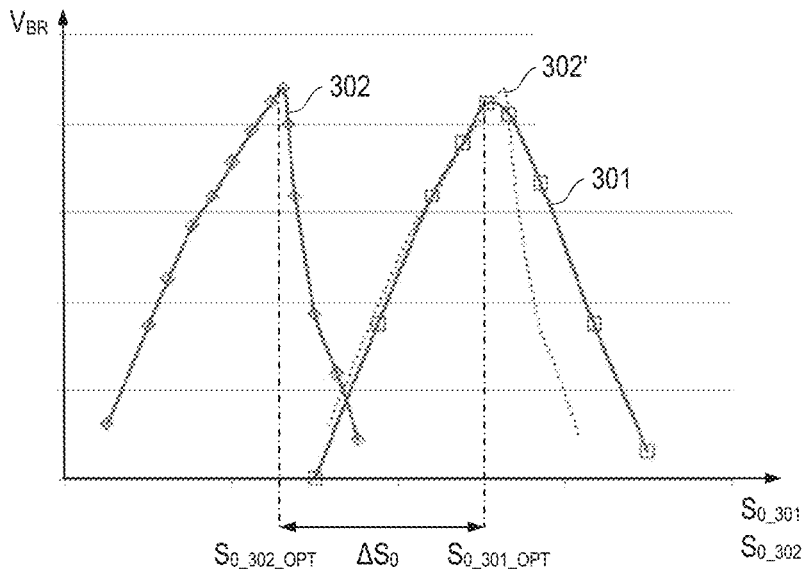

FIG. 4B illustrates the voltage blocking capability $V_{BR}$ of an edge termination structure of the type illustrated in FIG.

1A and of a conventional edge termination structure dependent on the maximum doping dose $S_0$. More specifically, curve 301 shown in FIG. 4B illustrates the voltage blocking capability $V_{BR}$ of the edge termination structure of the type shown in FIG. 1A and having a doping dose profile of the third region 31 as illustrated by curve 201 in FIG. 4A, and curve 302 illustrates the voltage blocking capability of a conventional edge termination structure having a doping dose profile of the third region as illustrated by curve 202 shown in FIG. 4A. Each of curves 301, 302 illustrates the voltage blocking capability dependent on the respective maximum doping dose. As can be seen from FIG. 4B, there is an optimum maximum doping dose $S_{0\_301\_OPT}$, $S_{0\_302\_OPT}$ in each case, wherein the voltage blocking capability $V_{BR}$ has a maximum when the maximum doping dose $S_{0\_301}$, $S_{0\_302}$ has the respective optimum value $S_{0\_301\_OPT}$, $S_{0\_302\_OPT}$. The maximum voltage blocking capabilities are essentially the same, wherein the maximum voltage blocking capability of the edge termination structure according to FIG. 1A is slightly lower than the maximum voltage blocking capability of the conventional edge termination structure. This can be seen by comparing curve 301 with curve 302', wherein curve 302' results from curve 302 by shifting by $\Delta S_0$ to the right.

According to one example, the maximum doping dose $S_{0\_302\_OPT}$ of the conventional edge termination structure is about 1.2 E12 cm$^{-2}$ in a silicon based semiconductor device, and the maximum doping dose $S_{0\_301\_OPT}$ is about 1.73 E12 cm$^{-2}$ in a silicon based semiconductor device, so that in this example $\Delta S_0$ is about 5.3 E11 cm$^{-2}$. The maximum voltage blocking capabilities associated with these edge termination structures are about 8200 V, wherein the maximum voltage blocking capability in the inner region 11 is about 8600V.

Curves 301, 302 illustrated in FIG. 4B each have essentially the form of a parabola and may therefore be referred to as blocking parabolas in the following. As can be seen from FIG. 4B, the blocking parabola 301 associated with the edge termination structure of the type illustrated in FIG. 1A is wider than the blocking parabola 302 associated with the conventional edge termination structure. In each case, when the doping dose deviates from the respective optimum doping dose $S_{0\_301\_OPT}$, $S_{0\_302\_OPT}$, the voltage blocking capability $V_{BR}$ decreases. That is, when the doping dose in the conventional edge termination structure deviates from the optimum doping dose $S_{0\_302\_OPT}$ by a certain percentage the voltage blocking capability $V_{BR}$ is reduced by a first percentage as compared to the maximum voltage blocking capability $V_{BR\_302}$. Equivalently, when the doping dose in the edge termination structure 30 deviates by the certain percentage from the optimum doping dose $S_{0\_301\_OPT}$ the voltage blocking capability $V_{BR}$ decreases by a second percentage as compared to the maximum voltage blocking capability $V_{BR\_301}$. As the blocking parabola 301 associated with the edge termination structure according to FIG. 1A is wider than the blocking parabola 302 associated with the conventional edge termination structure, the second percentage is lower than the first percentage. This means that the edge termination structure according to FIG. 1A is more robust against parasitic charges in the passivation layer 32 because these parasitic charges have the same effect as a variation of the doping dose of the third semiconductor region 31.

According to one example, the amorphous passivation layer has a relatively high density of states $N_F$. More specifically, the density of states $N_F$ in the passivation layer 32 is given by:

$$N_F \geq \frac{1}{\varepsilon} \cdot \left(\frac{Q_{BR}}{E_g}\right)^2, \tag{2}$$

where $Q_{BR}$ is the breakdown charge explained above, $\varepsilon=80$. Er is the permittivity of the semiconductor material of the semiconductor body 100, and $E_g$ is the bandgap of the semiconductor material of the semiconductor body 100. The bandgap is dependent on the type of semiconductor material and the temperature. In silicon at a temperature of 300K, for example, the bandgap $E_g$ is 1.12 eV, and in 6H-SiC, the band gap $E_g$ at 300K is 3.03 eV. The density of states (DOS) in the passivation layer 32 can be measured by optical measurement methods. This is disclosed, for example, in K. Chew et al.: "Gap state distribution in amorphous hydrogenated silicon carbide films deduced from photothermal deflection spectroscopy", JOURNAL OF APPLIED PHYSICS, VOLUME 91, NUMBER 7, 1 Apr. 2002, pages 4319-4325. The amorphous passivation layer 32, according to one example, is made from one of the following materials: amorphous hydrogen-containing carbon (aC:H), amorphous silicon (aSi), amorphous silicon carbide (aSiC), or amorphous hydrogen-containing silicon carbide (aSiC:H). A thickness of the amorphous passivation layer 32 is between 200 nanometers (nm) and 2 micrometers (μm), for example.

The amorphous passivation layer 32 can be produced by a chemical vapor deposition process (CVD), in particular, a radio frequency (RF) plasma-enhanced chemical vapor deposition (PECVD) process. An RF PECVD process is commonly known, so that no details of these type of process are required. Basically, a PECVD process includes placing the semiconductor body 100 in a reactor, introducing process gases into the reactor, activating gas species that are to be deposited on the semiconductor body 100 by plasma, an adsorption of the activated gas species on the first surface 101, thereby forming the solid amorphous passivation layer 32. Forming an a-SiC:H layer may include using silane (SiH$_4$) and methane (CH$_4$) as process gases, wherein silicon (Si) and carbon (C) from these process gases are activated gas species that are deposited on the surface 101 in order to form the amorphous hydrogen-containing silicon carbide (a-SiC:H) layer. Forming an amorphous hydrogen-containing carbon (a-C:H) layer may include using methane (CH$_4$) as a process gas, wherein carbon (C) and hydrogen (H) are reactive species.

The amorphous passivation layer 32 provides counter-charges to ionized dopant atoms in the third semiconductor region 31 when the pn-junction between the third semiconductor region 31 and the second semiconductor region 21 is reverse biased. This is due to a contact potential at an interface between the amorphous passivation layer 32 and the third region 31 and under the influence of a lateral electric field resulting from the reverse biasing of the pn-junction. The higher the density of states (DOS), the more countercharges can be made available in the amorphous passivation layer 32, because the higher the DOS, the shorter is a shielding length $L_a$, $$L_a = \sqrt{\frac{\varepsilon}{q^2 \cdot N_F}}, \tag{3}$$

and the shorter the shielding length $L_a$, the higher is the capability of the amorphous passivation layer 32 to provide counter charges (image charges, mirror charges). In other words, a high density of states of the amorphous passivation layer makes it possible to implement the third region 31 with a high doping dose without decreasing the voltage blocking capability, wherein the high doping dose, as referred above, increases the robustness of the edge termination structure.

The density of states (DOS) in the amorphous passivation layer 32 can be adjusted by suitably selecting process parameters in the deposition process. These process parameters include, for example, a flow rate of the at least one process gas, a temperature in the reactor during the deposition process, a frequency value of the RF. Forming an amorphous hydrogen-containing silicon carbide (a-SiC:H) layer having a DOS as given in equation (2) may include an RF PECVD process using silane as silicon source and methane ($CH_4$) as carbon source. A gas flow of these gases may be adjusted to between 50 . . . 500 sccm, the RF frequency may be 13.56 MHz, and a temperature may be selected from between 200° C. and. 400° C. Optionally, hydrogen or helium may be used as a dilution gas.

Referring to the above, the doping dose S of the third region 31 decreases towards the edge 103, wherein in the middle (at position x1) of the edge termination structure 30 in the semiconductor body 100 the doping dose S is higher than the breakthrough dose $S_{BR}$. According to one example, the doping dose S falls below the breakthrough dose $S_{BR}$ at a position that is spaced apart from the first region 11 (that is, from the beginning x0 of the edge termination structure 30 in the semiconductor body 100) by a distance that is between 50% and 60%, in particular between 60% and 70% of the overall width w30 of the edge termination structure 30. The maximum of the doping dose $S_0$ of the third semiconductor region 31 is selected from between 1.50 times and 2 times the breakthrough dose $S_{BR}$, for example. It should be noted that "doping dose" as used herein denotes the electrically active doping dose.

Referring to the above, the doping dose as of the third region 31 can be essentially constant between the beginning x0 and the middle x1 of the edge termination structure 30. This, however, is only an example. According to further examples illustrated in FIGS. 5A and 5B, the doping dose S may already decrease between the beginning x0 and the middle x1 of the edge termination structure 30. Referring to curve 401 shown in FIG. 5A this may include that the doping dose S is essentially constant over a certain range beginning at the position x0 and then starts to decrease before the position x1. However, referring to curves 402, 403 and 404 a decreasing doping dose between the beginning x0 and the middle x1 may also include that the doping dose essentially constantly decreases between the beginning x0 and the middle x1. In each case, a magnitude of average normalized slope $|m1|$ of the doping dose between the beginning x0 and the middle x1 is given by $$|m1| = \frac{w30}{x1 - x0} \cdot \left[\frac{S(x_0) - S(x_1)}{S(x_0)}\right] = 2 \cdot \left[1 - \frac{S(x_1)}{S(x_0)}\right], \quad (4)$$

where S(x0) denotes the doping dose at the beginning x0 and S(x1) denotes the doping dose in the middle x1 of the edge termination structure 30, and x1−x0 (=0.5·w30) is the distance between the beginning x0 and the middle x1. In each case, the doping dose in the middle x1 is higher than the breakthrough dose $S_{BR}$.

Figure 5A:
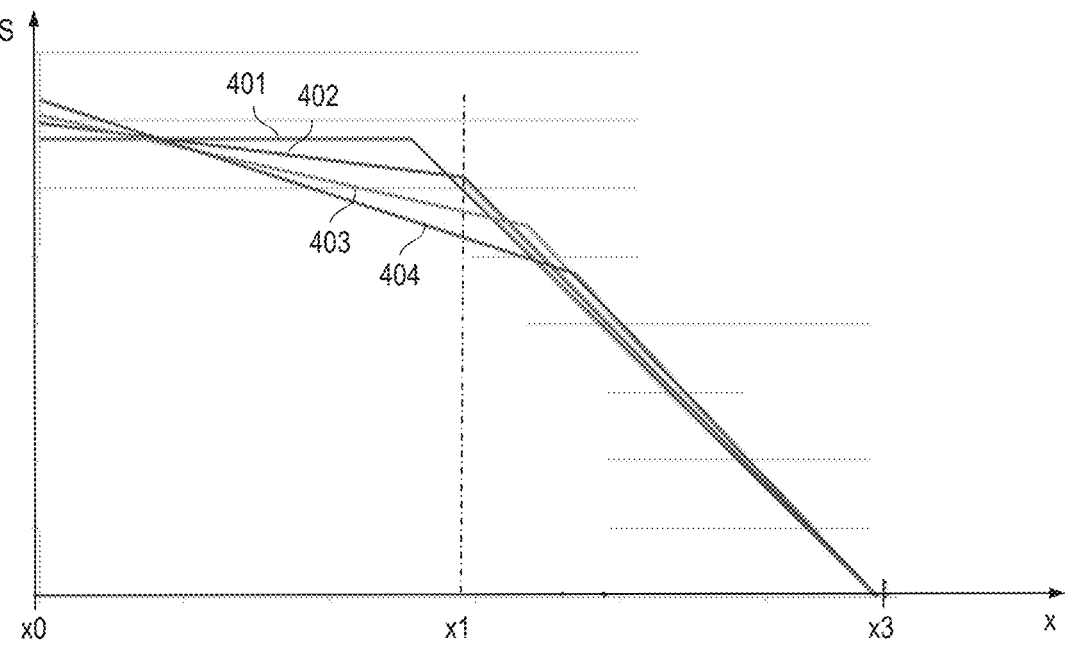
FIGS. 5A and 5B illustrate the dependency of a voltage blocking capability of a semiconductor device of the type illustrated in FIG. 1A on a slope of a doping dose profile and the doping dose.
Figure 5B:
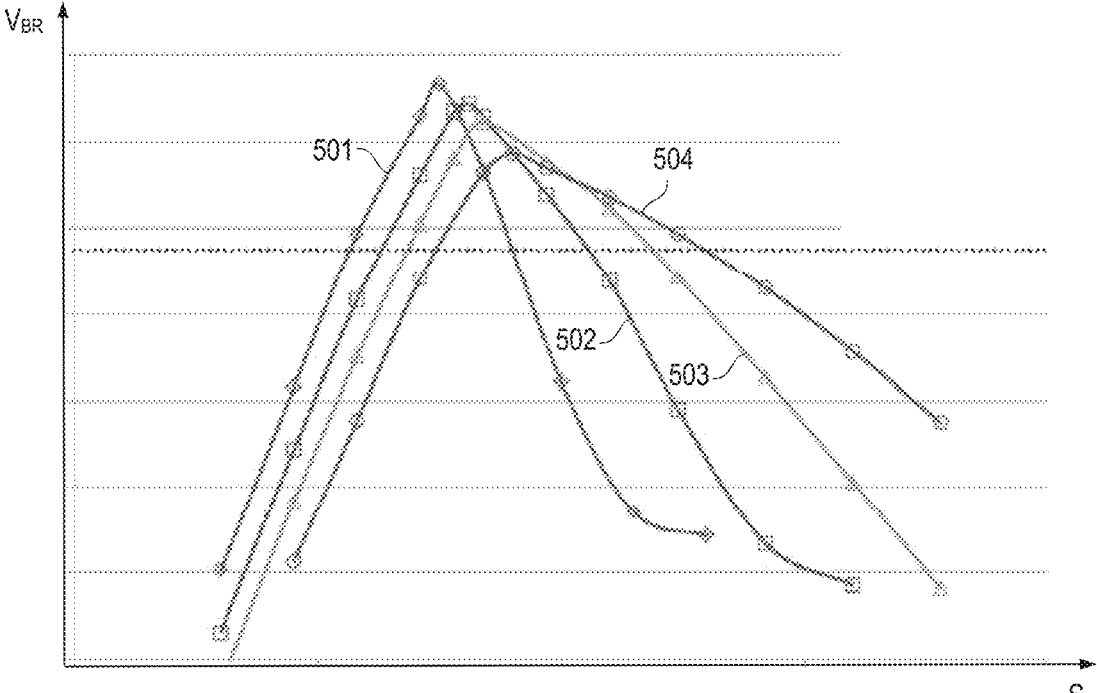

FIG. 5B illustrates blocking parabolas corresponding to the doping dose profiles illustrated in FIG. 5A, wherein curve 501 is the blocking parabola associated with the doping dose profile 401 shown in FIG. 5A, curve 502 is the blocking parabola associated with the doping dose profile 402 shown in FIG. 5A, curve 503 is the blocking parabola associated with the doping dose profile 403 shown in FIG. 5A, and curve 504 is the blocking parabola associated with the doping dose profile 404 shown in FIG. 5A. Referring to FIG. 5A, curve 401 has the lowest average slope |m|, and curve 404 has the highest average slope |m| of the four curves illustrated in this Figure. The slope of curve 402 is higher than the slope of curve 401 and lower than the slope of curve 403, and the slope of curve 403 is lower than the slope of curve 404. As can be seen from FIG. 5B, the higher the average slope between the beginning x0 and the middle x1, the wider the corresponding blocking parabola. That is, in the example illustrated in FIG. 5B, blocking parabola 504 associated with doping dose profile 404 is wider than each of the other blocking parabolas, and blocking parabola 501 associated with doping dose profile 401 is narrower than each of the other blocking parabolas. FIG. 5B illustrates the maximum voltage blocking capabilities $V_{BR}$ dependent on the respective maximum doping dose, which is the doping dose at the position x0 in this example. Further, as can be seen from FIG. 5B, the maximum voltage blocking capability $V_{BR}$ decreases as the average slope increases. Thus, there is a tradeoff between the maximum voltage blocking capability and the robustness. According to one example, the third region 31 is implemented such that the magnitude of the average normalized slope |m| is higher than 0.1 and lower 0.6, that is, $0.1 < |m1| < 0.6$.

Figure 6A:
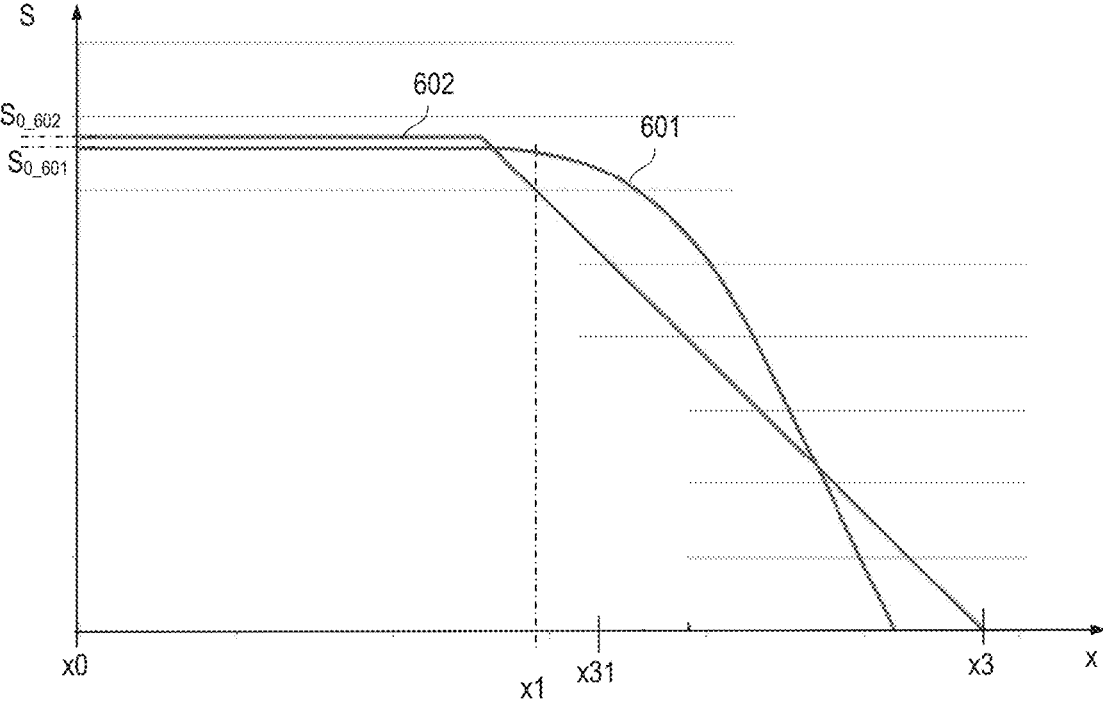
FIGS. 6A and 6B illustrate another example of a dependency of a voltage blocking capability of a semiconductor device of the type illustrated in FIG. 1A on a slope of a doping dose profile and the doping dose.
Figure 6B:
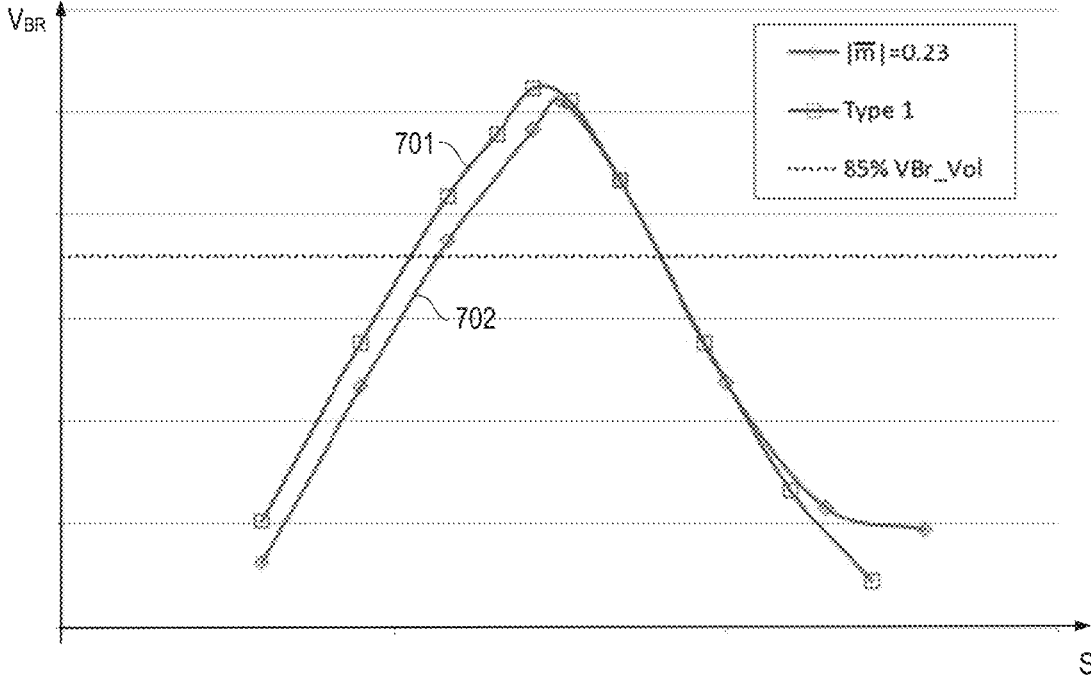

FIG. 6A illustrates doping profile 601, 602 according to two further examples, and FIG. 6B illustrates the corresponding blocking parabolas, wherein blocking parabola 701 shown in FIG. 6B is associated with doping dose profile 601 shown in FIG. 6A and blocking parabola 702 shown in FIG. 6B is associated with doping dose profile 602 shown in FIG. 6A. The doping dose profiles 601, 602 shown in FIG. 6A are different in the slope of the doping dose profile between the middle x1 and the end x3 of the edge termination structure 30. The "end x3" is the position where the surface section 33 either adjoins the channel stopper 22 or the edge surface 103. Referring to FIG. 6A, the doping dose profile 601 has a higher magnitude of the slope than the doping dose profile 602. As can be seen from FIG. 6B, the greater slope of profile 601 results in a wider blocking parabola. According to one example, a magnitude of average normalized slope |m2| in a region of the edge termination structure 30 that ranges from the end x3 to a position x31 that is spaced apart from the end x3 by 0.4·w30 is between 1.5 and 10, $1.5 < |m2| < 10$, in particular between 2 and 10, wherein $$|m2| = \frac{w30}{x3 - x31} \cdot \left[\frac{S(x31) - S(x3)}{S(x0)}\right] = \frac{w30}{0.4 \cdot w30} \cdot \left[\frac{S(x31) - S(x3)}{s(x0)}\right], \quad (5)$$

where S(x31) is the (effective) doping dose at position x31 and S(x3) is the (effective) doping dose at the end x3 of the edge termination structure, which may be zero. Further, and x3−x31 (=0.4·w30) is the distance between the end x3 and the position x31.

Figure 7A:
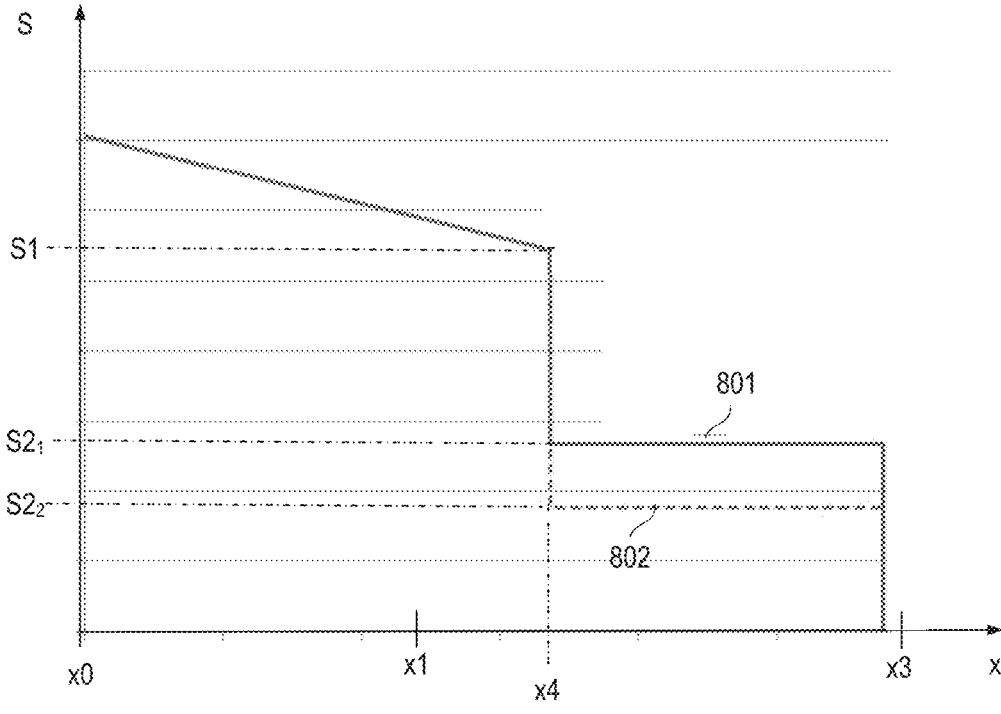
FIGS. 7A and 7B illustrate a dependency of a lateral electric field in a semiconductor device of the type illustrated in FIG. 1A on a slope of a doping dose profile.
Figure 7B:
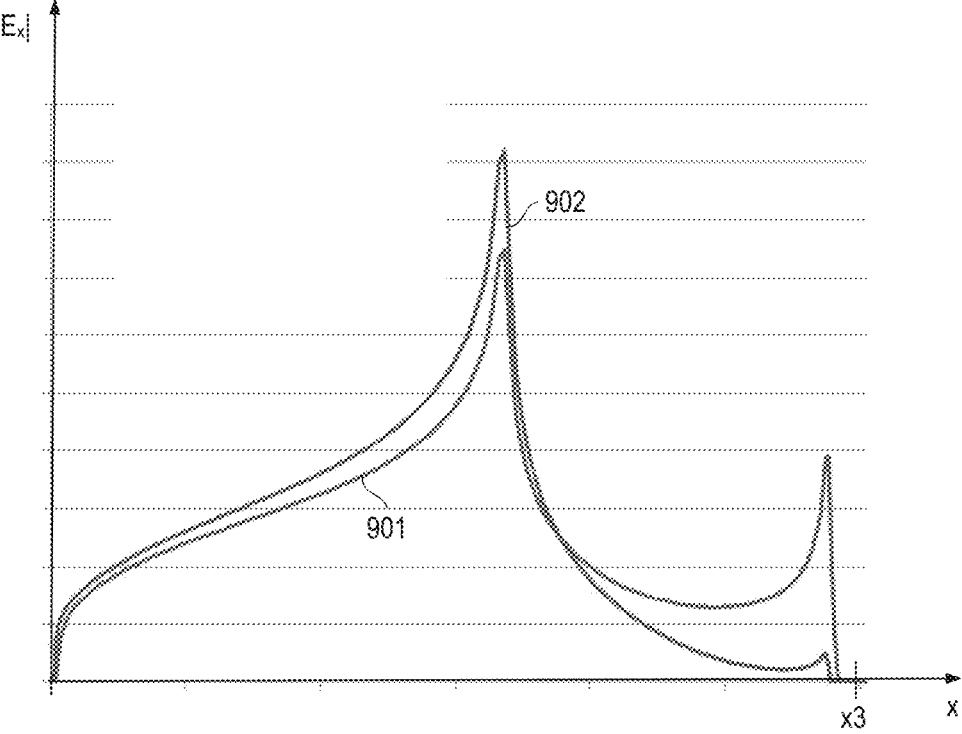

FIG. 7A illustrates two further examples of doping profiles 801, 802. In each of these examples, the doping dose abruptly changes from a start level S1 to a respective end level $S2_1$, $S2_2$ at a position that is located between the middle x1 and the end x3 of the edge termination structure. FIG. 7B illustrates the magnitude of a lateral component $|E_x|$ of the electric field in the third region 31 when the pn-junction between the second region 21 and the third region 31 is reverse biased, wherein curve 901 shown in FIG. 7B is associated with profile 801 shown in FIG. 7A and curve 902 shown in FIG. 7B is associated with profile 802 shown in FIG. 7A. As can be seen from FIG. 7B, a maximum of the electric field occurs at the position x4 where the doping dose abruptly decreases, wherein the larger the difference between the start level S1 and the respective end level $S2_1$, $S2_2$ the higher the maximum.

According to one example, the doping dose profile of the third region 31 has a profile as shown in FIG. 7A, that is, the doping dose abruptly changes from a start level S1 to an end level S2 at a position x4 between the middle x1 and the end of the edge termination structure x3, wherein a ratio S2/S1 between the end level S2 and the start level S1 is lower than 0.9 and greater than 0.5, that is, 0.5<S2/S1<0.9.

An edge termination structure 30 of the type explained herein before can be implemented in various kinds of semiconductor devices. Two examples are explained in the following.

Figure 8:
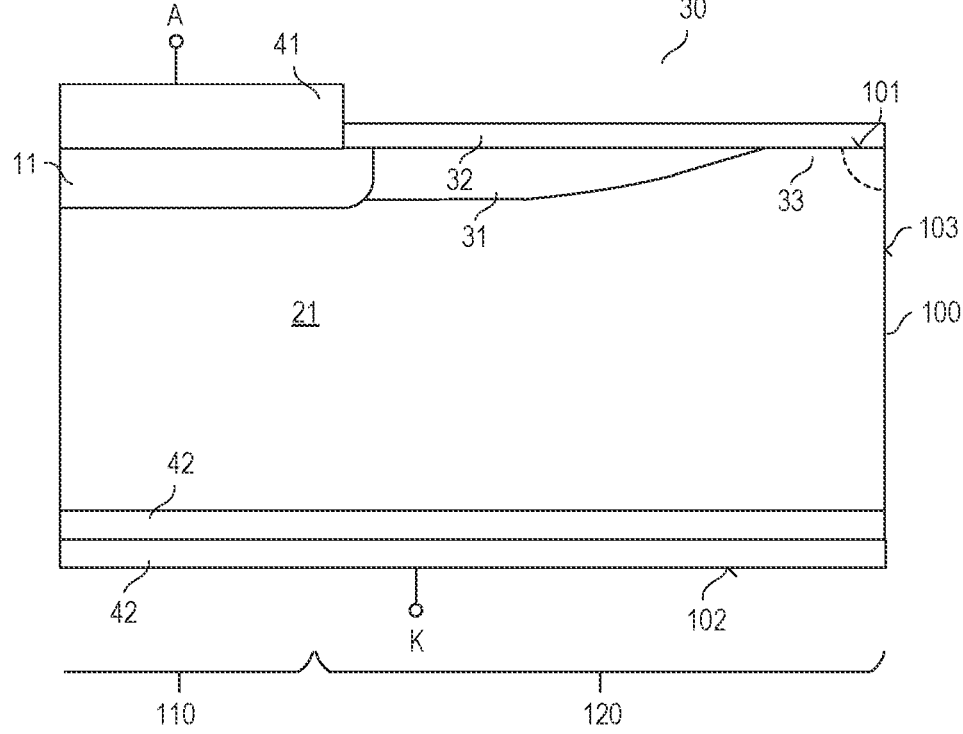
FIG. 8 shows a vertical cross-sectional view of one section of a semiconductor device implemented as diode.

Referring to FIG. 8, the semiconductor device can be implemented as a diode. In this case, the first region 11 forms a first emitter region and the second region 21 forms a base region of the diode. The first emitter region 11 is connect to a first electrode 41. The diode further includes a second emitter region 42 of the same doping type as the second region 21, but more highly doped than the second region 21. According to one example, the doping concentration of the second emitter region 42 is in the same range as the doping concentration of the first region 11. The second emitter region 42 forms a second surface 102 of the semiconductor body 100 and is connected to a second electrode 42. According to one example, the first region 11 is p-doped, so that it forms a p-type emitter of the diode, and the second emitter region 42 is n-doped, so that it forms an n-type emitter of the diode. In this case, the first electrode 41 forms an anode and the second electrode 42 forms a cathode of the diode.

Figure 9A:
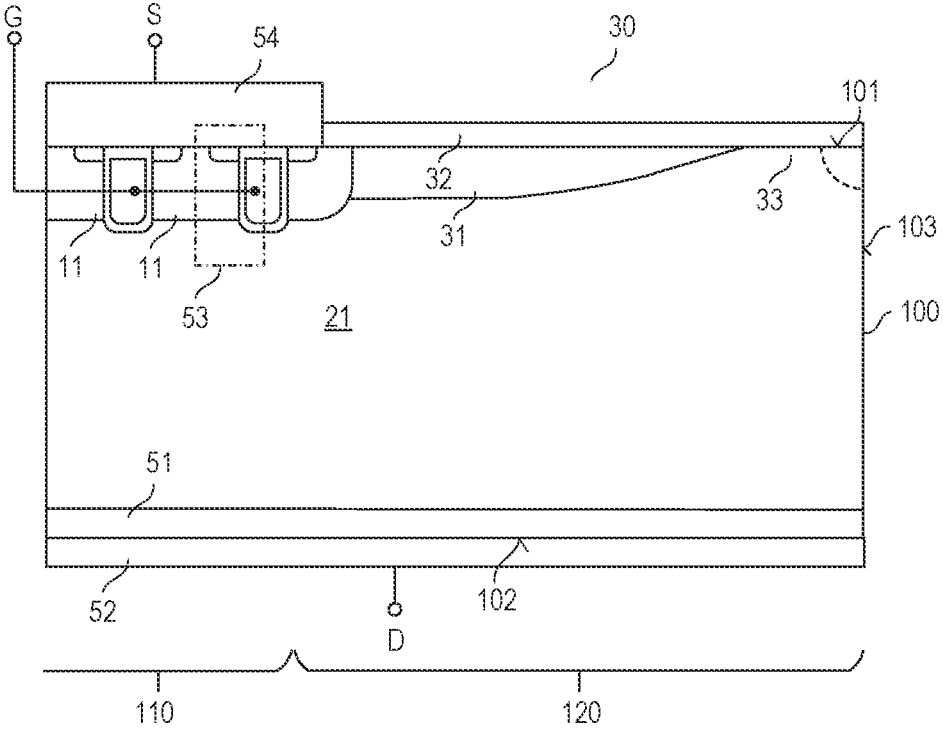
FIGS. 9A and 9B show a vertical cross-sectional view of one section of a semiconductor device implemented as transistor device.
Figure 9B:
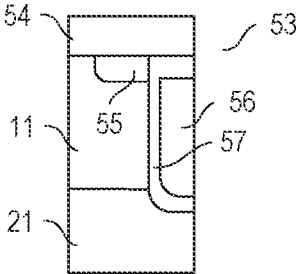

According to another example illustrated in FIG. 9A, the semiconductor device is implemented as a transistor device. The transistor device includes a plurality of transistor cells 53, wherein one transistor cell 53 is illustrated in detail in FIG. 9B. Referring to FIG. 9B each transistor cell 53 includes one section of the first region 11, wherein this section of the first region 11 forms a body region of the transistor cell 53. Further, each transistor cell 53 includes a source region 55, wherein the source region 55 is separated from the second region 21 by the body region 11. The second region 21 forms a drift region of the transistor device. The source region 53 and the body region 11 are connected to a first electrode 54 which forms a source electrode of the transistor device. Referring to FIG. 9B, the body region 11 may adjoin the first surface 101. This, however, is only an example. According to another example (not illustrated) the source region 55 separates the body region 11 from the first surface 101. In this case, contact plugs (not shown) extend from the source electrode 54 through the source region 55 into the body region 11.

Referring to FIGS. 9A and 9B each transistor cell further includes a gate electrode 56 that is dielectrically insulated from the body region 11 by a gate dielectric 57. The gate electrodes 56 of the individual transistor cells 53 are connected to a gate node G, which is schematically illustrated in FIG. 9A.

Referring to FIG. 9A, the transistor device further includes a drain region 51. The drain region 51 adjoins the second surface 102 of the semiconductor body 100.

The transistor device can be implemented as a MOSFET. In this case, the drain region 51 has the same doping type as the drift region 21, but is more highly doped. According to another example, the transistor device is implemented as an IGBT. In this case, the drain region 51 (which is also referred to as collector region in this case) has a doping type complementary to the doping type of the drift region 21. The source region 55 has the same doping type as the drift region 21, but is more highly doped. Doping concentrations of the source region 55 and the drain region 51 are in the range of between 1E19 $cm^{-3}$ and 1E21 $cm^{-3}$, for example.

Figure 10:
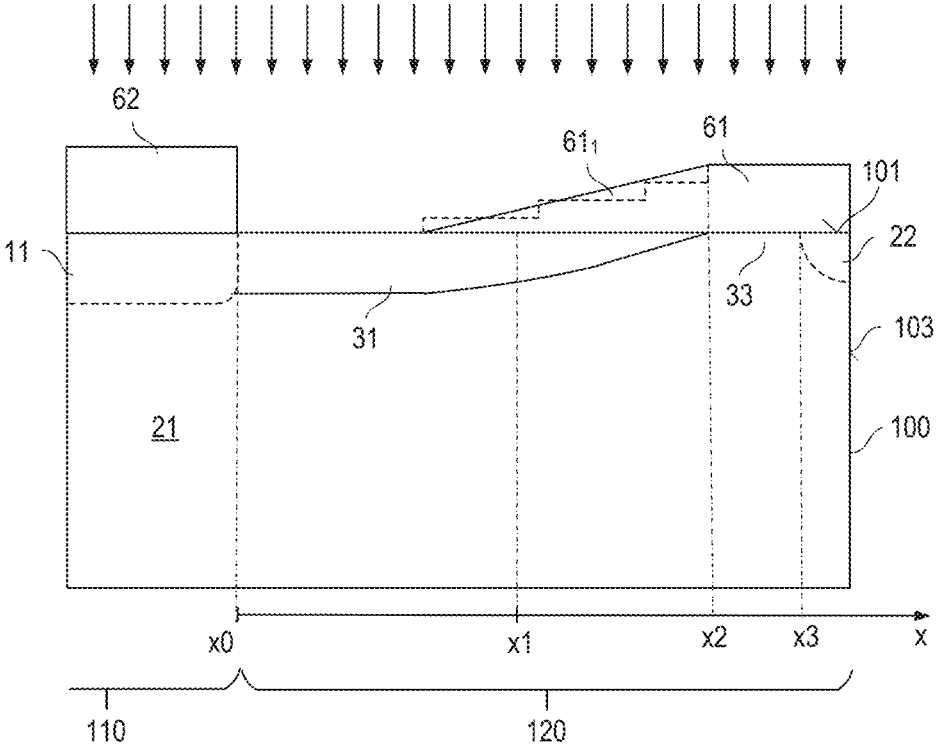
FIG. 10 illustrates one example of a method for producing a doped semiconductor region of the edge termination structure.

FIG. 10 illustrates one example of a method for producing a third region 31 of the type explained herein before. Referring to FIG. 10, forming the third region 31 may include implanting dopant atoms via the first surface 101 into the semiconductor body 100 using an implantation mask. According to one example, this implantation mask has a first section 61 with a varying thickness that increases towards the edge surface 103. The thicker the first mask section 61 at a certain position, the less dopant atoms pass the first mask section 61 during the implantation process, so that the doping dose, below the first mask section 61 decreases towards the edge surface 103. The thickness of the first mask section 61 may continually increase towards the edge surface 103 or may increase in steps (as illustrated by $61_1$ in FIG. 10). A second mask section 62 above the first region 11 is thick enough to prevent doping atoms from passing this second mask section 62 during the implantation process. The first region 11 can be formed before or after forming the third region 31.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body with a first main surface, an edge surface, an inner region, and an edge region arranged between the inner region and the edge surface;
a first semiconductor region of a first doping type arranged in the inner region;
a second semiconductor region of a second doping type arranged in the inner region and the edge region, wherein a pn-junction is formed between the first semiconductor region and the second semiconductor region; and
an edge termination structure comprising:
a third semiconductor region of the first doping type arranged in the edge region and adjoining the first semiconductor region, wherein a doping dose of the third semiconductor region decreases towards the edge surface;
a surface section of the second semiconductor region adjoining the first main surface; and an amorphous passivation layer having a specific resistance higher than $10^9$ $\Omega$cm, formed on the first main surface, and adjoining the third semiconductor region and the surface section of the second semiconductor region, wherein the edge termination structure has a width in the semiconductor body in a lateral direction, and wherein an electrically active doping dose of the third semiconductor region at a lateral position spaced apart from the first semiconductor region by 50% of the width of the edge termination structure is at least $Q_{BR}/q$, wherein $Q_{BR}$ is a breakdown charge of a semiconductor material of the semiconductor body and q is the elementary charge.

2. The semiconductor device of claim 1, wherein a width of the surface section of the second semiconductor region is less than ⅓ of the width of the edge termination structure in the semiconductor body.

3. The semiconductor device of claim 1, wherein a maximum electrically active doping dose of the third semiconductor region is in a range between 1.05 times and 2 times $Q_{BR}/q$.

4. The semiconductor device of claim 1, wherein the width of the edge termination structure is between 2 times and 3 times a dimension of the second semiconductor region in a vertical direction of the semiconductor body in the inner region.

5. The semiconductor device of claim 1, further comprising:

a channel stopper of the second doping type arranged in the second semiconductor region in the edge region, wherein the third semiconductor region and the surface section of the second semiconductor region are arranged between the first semiconductor region and the channel stopper.

6. The semiconductor device of claim 1, wherein a doping dose of the first semiconductor region is higher than 10 times of a maximum doping dose of the second semiconductor region.

7. The semiconductor device of claim 1, wherein an average of a magnitude of a normalized slope of a doping dose profile of the third semiconductor region in the lateral direction in a section between the first semiconductor region and the lateral position is higher than 0.1 and lower than 0.6.

8. The semiconductor device of claim 1, wherein the semiconductor body comprises monocrystalline silicon.

9. The semiconductor device of claim 1, wherein the semiconductor body comprises monocrystalline silicon carbide.

10. The semiconductor device of claim 1, wherein a material of the amorphous passivation layer is selected from the group consisting of:

amorphous hydrogen-containing carbon (a-C:H);

amorphous silicon (a-Si);

amorphous silicon carbide (a-SiC); and amorphous hydrogen-containing silicon carbide (aSiC: H).

11. The semiconductor device of claim 1, wherein the semiconductor device is implemented as a vertical diode in which the first semiconductor region forms a first emitter region and the second semiconductor region forms a base region, the semiconductor device further comprising:

a second emitter region of the second doping type, wherein the base region is arranged between the first emitter region and the second emitter region.

12. The semiconductor device of claim 1, wherein the semiconductor device is implemented as a vertical transistor in which the first semiconductor region forms a body region and the second semiconductor region forms a drift region, the semiconductor device further comprising:

at least one source region of the second doping type, wherein the body region is arranged between the source region and the drift region;

at least one gate electrode arranged adjacent to the body region and dielectrically insulated from the body region by a gate dielectric; and a drain region, wherein the drift region is arranged between the drain region and the body region.

13. The semiconductor device of claim 12, wherein the vertical transistor is an IGBT and the drain region is of the second doping type.

14. The semiconductor device of claim 12, wherein the vertical transistor is a MOSFET and the drain region is of the first doping type.

15. The semiconductor device of claim 1, wherein the specific resistance of the amorphous passivation layer is lower than 1E14 $\Omega$cm.

* * * * *